(12) United States Patent
Li

(10) Patent No.: US 10,892,303 B2
(45) Date of Patent: Jan. 12, 2021

(54) ELECTRONIC DEVICE AND MANUFACTURING METHOD FOR SAME

(71) Applicant: GUANGDONG OPPO MOBILE TELECOMMUNICATIONS CORP., LTD., Guangdong (CN)

(72) Inventor: Jie Li, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/176,534

(22) Filed: Oct. 31, 2018

(65) Prior Publication Data

US 2019/0280057 A1    Sep. 12, 2019

(30) Foreign Application Priority Data

Mar. 9, 2018  (CN) ............... 2018 1 0193173

(51) Int. Cl.
*G09G 1/00* (2006.01)
*H01L 27/32* (2006.01)
(Continued)

(52) U.S. Cl.
CPC .......... *H01L 27/3227* (2013.01); *G01S 17/08* (2013.01); *G09G 3/3225* (2013.01);
(Continued)

(58) Field of Classification Search
USPC ......... 345/589, 173, 174, 426, 207, 690, 77, 345/102, 691; 257/40; 362/97.1
See application file for complete search history.

(56) References Cited

U.S. PATENT DOCUMENTS

2008/0006762 A1\* 1/2008 Fadell ................ G01J 1/44
250/201.1
2008/0284719 A1\* 11/2008 Yoshida ........... G02F 1/136209
345/102
(Continued)

FOREIGN PATENT DOCUMENTS

CN    106385475    2/2017
CN    106686235    5/2017
(Continued)

OTHER PUBLICATIONS

SIPO, First Office Action for CN Application No. 201810193173.8, dated Jul. 3, 2019.
(Continued)

*Primary Examiner* — Thuy N Pardo
(74) *Attorney, Agent, or Firm* — Hodgson Russ LLP

(57) ABSTRACT

An electronic device and a manufacturing method for the same are provided. The electronic device includes a light-permeable display screen and an optical sensor. The light-permeable display screen has a first surface and a second surface facing away from the first surface. The second surface includes a display area and a black matrix area surrounding the display area. The black matrix area includes a first window region. The optical sensor is disposed opposite to the second surface of the light-permeable display screen, and includes an emitter and a receiver. The emitter is configured to emit an infrared light through the first window region and the receiver is configured to receive the infrared light through the light-permeable display screen.

16 Claims, 11 Drawing Sheets

(51) Int. Cl.
*G01S 17/08* (2006.01)
*H05K 9/00* (2006.01)
*G09G 3/3225* (2016.01)
*H01L 23/552* (2006.01)
*H01L 51/52* (2006.01)
*H01L 51/56* (2006.01)
*H04M 1/02* (2006.01)
*G06F 1/16* (2006.01)

(52) U.S. Cl.
CPC .......... *H01L 23/552* (2013.01); *H01L 27/323* (2013.01); *H01L 27/3269* (2013.01); *H01L 51/524* (2013.01); *H01L 51/529* (2013.01); *H01L 51/5284* (2013.01); *H01L 51/56* (2013.01); *H04M 1/026* (2013.01); *H05K 9/0054* (2013.01); *G06F 1/1626* (2013.01); *G06F 1/1643* (2013.01); *G06F 1/1656* (2013.01); *G06F 1/1684* (2013.01); *G09G 2320/0626* (2013.01); *G09G 2360/144* (2013.01); *H01L 2227/323* (2013.01); *H04M 1/0266* (2013.01); *H04M 2250/12* (2013.01)

(56) References Cited

U.S. PATENT DOCUMENTS

| 2012/0069042 | A1* | 3/2012 | Ogita | H04M 1/0264 345/589 |
| 2013/0094184 | A1* | 4/2013 | Lee | G02F 1/133512 362/97.1 |
| 2014/0253606 | A1* | 9/2014 | Yun | G09G 3/20 345/690 |
| 2015/0263308 | A1* | 9/2015 | Park | H01L 51/529 257/40 |
| 2016/0054175 | A1 | 2/2016 | Jia et al. | |
| 2016/0098956 | A1* | 4/2016 | Park | G09G 3/3233 345/77 |
| 2016/0164036 | A1* | 6/2016 | Jung | H01L 51/5253 257/40 |
| 2016/0221293 | A1* | 8/2016 | Park | B32B 38/145 345/691 |
| 2017/0293181 | A1* | 10/2017 | Jung | H01L 27/322 345/173 |
| 2019/0088723 | A1* | 3/2019 | Shi | H01L 27/322 345/174 |

FOREIGN PATENT DOCUMENTS

| CN | 206451466 | 8/2017 |
| CN | 107124484 | 9/2017 |
| CN | 107135290 | 9/2017 |
| CN | 107332948 | 11/2017 |
| CN | 107656577 | 2/2018 |
| CN | 107767835 | 3/2018 |
| CN | 108600419 | 9/2018 |
| EP | 2584767 | 4/2013 |
| EP | 2827185 | 1/2015 |
| EP | 3544268 | 9/2019 |
| WO | 2019170005 | 9/2019 |
| WO | 2019170013 | 9/2019 |

OTHER PUBLICATIONS

WIPO, English Translation of ISR/WO for PCT/CN2018/116324, dated Feb. 14, 2019.
EPO, Office Action for EP Application No. 18206987, dated Feb. 25, 2019.
SIPO, Decision on Rejection for CN Application No. 201810193173.8, dated Mar. 4, 2020.
IPI, Office Action for IN Application No. 201814043337, dated Jul. 20, 2020.
EPO, Extended European Search Report for EP Application No. 20188514.2, dated Sep. 21, 2020.

* cited by examiner

30

Coating a coating layer at the first window region and the coating layer shielding the emitter — S305

Providing a second window region opposite to the receiver in the display area — S306

Providing a second window region opposite to the receiver in the black matrix area — S307

Coupling a buffer layer to the second surface of the light-permeable display screen — S308

Providing a metal sheet below the buffer layer — S309

Fig. 22

ELECTRONIC DEVICE AND MANUFACTURING METHOD FOR SAME

CROSS REFERENCE TO RELATED APPLICATION

The present application claims priority to Chinese Application No. 201810193173.8, filed with the State Intellectual Property Office of P. R. China on Mar. 9, 2018, the entire disclosure of which is incorporated by reference.

FIELD

The present disclosure relates to a technical field of electronic technologies, and particularly to an electronic device and a manufacturing method for the same.

BACKGROUND

In an electronic device, such as a mobile, a proximity sensor is provided in a top portion of the mobile phone to detect whether the mobile phone is in a call state or is put in a pocket, so as to control a display screen to have a self-lock, thus preventing misoperations of a user. With developments of the electronic device, a full-screen display has become a development tendency of the mobile phone. However, a high screen-to-body ratio of the full-screen display leaves limited space for the proximity sensor or other elements in the display screen.

SUMMARY

Embodiments of a first aspect of the present disclosure provide an electronic device. The electronic device includes: a housing; a light-permeable display screen received in the housing and comprising a display area and a black matrix area surrounding the display area, the black matrix area comprising a first window region; an emitter arranged at a side of the light-permeable display screen and opposite to the first window region of the black matrix area; and a receiver arranged at the side of the light-permeable display screen and configured to communicate with the emitter.

Embodiments of a second aspect of the present disclosure provide another electronic device. The electronic device includes: a light-permeable display screen having a first surface and a second surface facing away from the first surface, the second surface including a display area and a black matrix area surrounding the display area, the black matrix area including a first window region; and an optical sensor disposed opposite to the second surface of the light-permeable display screen, including an emitter configured to emit an infrared light through the first window region and a receiver configured to receive the infrared light through the light-permeable display screen.

Embodiments of a third aspect of the present disclosure provide a manufacturing method for an electronic device. The manufacturing method includes: providing a light-permeable display screen, the light-permeable display screen includes a first surface and a second surface facing away from the first surface, the second surface includes a display area and a black matrix area surrounding the display area, the black matrix area includes a first window region; and providing an optical sensor, the optical sensor being disposed opposite to the second surface of the light-permeable display screen, including an emitter configured to emit an infrared light through the first window region and a receiver configured to receive the infrared light through the light-permeable display screen.

BRIEF DESCRIPTION OF THE DRAWINGS

The above and/or appended aspects and advantages of embodiments of the present disclosure will become apparent and more readily appreciated from the following descriptions made with reference the accompanying drawings.

FIG. 18 is a block diagram of the manufacturing method for the electronic device according to some embodiments of the present disclosure, in which a further action is illustrated.

FIG. 19 is a block diagram of the manufacturing method for the electronic device according to some embodiments of the present disclosure, in which a further action is illustrated.

FIG. 20 is a block diagram of the manufacturing method for the electronic device according to some embodiments of the present disclosure, in which a further action is illustrated.

FIG. 21 is a block diagram of the manufacturing method for the electronic device according to some embodiments of the present disclosure, in which a further action is illustrated.

FIG. 22 is a block diagram of the manufacturing method for the electronic device according to some embodiments of the present disclosure, in which a further action is illustrated.

DETAILED DESCRIPTION

Figure 1:
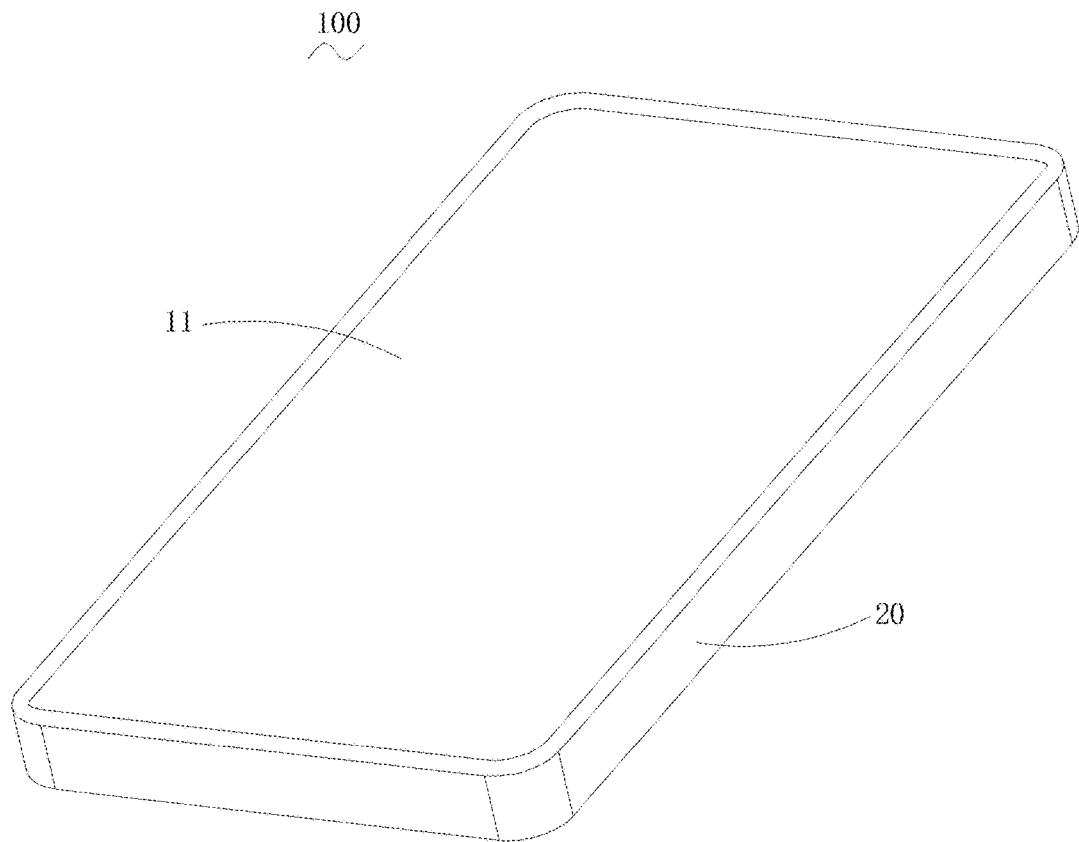
FIG. 1 is a perspective view of an electronic device in the present disclosure.

Embodiments of the present disclosure will be described in detail in the following. Examples of the embodiments are illustrated in the drawings. The same or similar elements and the elements having same or similar functions are denoted by like reference numerals throughout the descriptions. The embodiments described herein with reference to drawings are explanatory, and used to generally understand the present disclosure. The embodiments shall not be construed to limit the present disclosure.

An electronic device, such as a mobile phone or a tablet PC, usually is provided with an infrared sensor to detect a distance from the electronic device to a user. Tacking the mobile phone as an example, the infrared sensor is arranged in an upper portion of the mobile phone. When the user has a voice call or makes related operations, the mobile phone is moved towards the user's head, the infrared sensor feeds distance information back to a processor, and the processor performs a corresponding instruction, such as turning off lights of a display screen component. In the related art, in order to arrange the infrared sensor in the electronic device, a housing of the electronic device needs to be provided with a corresponding hole for emitting and receiving an infrared light signal. However, with developments of the electronic device, people have higher and higher requirements on an appearance and an operation experience of the mobile phone. The mobile phone has been developed to have a full-screen display, and there is an ultra-narrow bezel between the display screen component and the housing of the mobile phone having the full-screen display. The ultra-narrow bezel has such a small width that the ultra-narrow bezel may not have sufficient space to be provided with the hole. Even if the ultra-narrow bezel is provided with the hole, a strength of the whole ultra-narrow bezel will be reduced, thus decreasing reliability of the electronic device.

Embodiments of the present provide an electronic device. The electronic device includes a housing, a light-permeable display screen, an emitter and a receiver. The light-permeable display screen is received in the housing and includes a display area and a black matrix area surrounding the display area. The black matrix area includes a first window region. The emitter is arranged at a side of the light-permeable display screen and opposite to the first window region of the black matrix area. The receiver is arranged at the side of the light-permeable display screen and configured to communicate with the emitter.

Embodiments of the present further provide another electronic device. The electronic device includes a light-permeable display screen and an optical sensor. The light-permeable display screen has a first surface and a second surface facing away from the first surface. The second surface includes a display area and a black matrix area surrounding the display area. The black matrix area includes a first window region. An optical sensor is disposed opposite to the second surface of the light-permeable display screen, includes an emitter configured to emit an infrared light through the first window region and a receiver configured to receive the infrared light through the light-permeable display screen.

As illustrated in FIG. 1, an electronic device 100 according to embodiments of the present disclosure may be the mobile phone or the tablet PC. The mobile phone is taken as an example to describe the electronic device 100 according to embodiments of the present disclosure. Certainly, the electronic device 100 may have other specific forms, which will not be defined herein.

Figure 2:
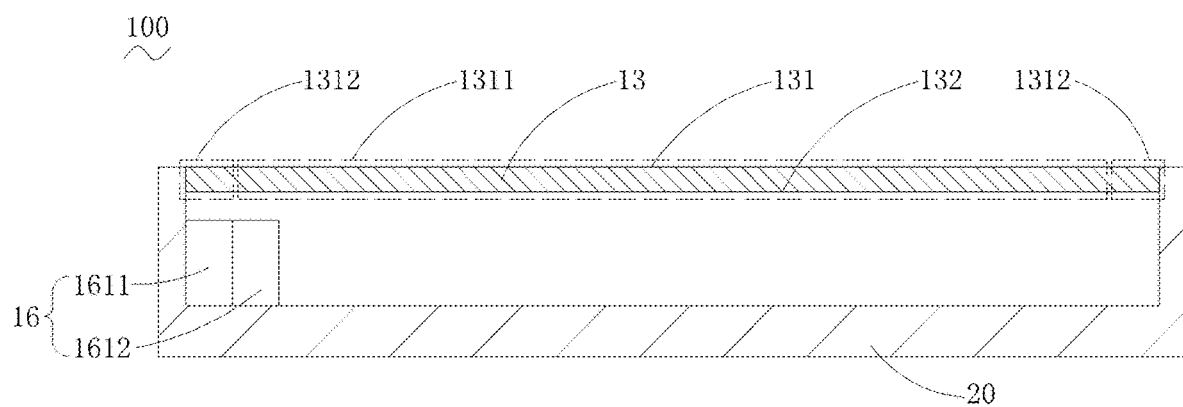
FIG. 2 is a sectional view of the electronic device according to some embodiments of the present disclosure.

As illustrated in FIG. 2, the electronic device 100 includes a light-permeable display screen 13 and an optical sensor 16.

The light-permeable display screen 13 includes a first surface 131 and a second surface 132 facing away from the first surface 131. The second surface 132 includes a display area 1311 and a black matrix area 1312, and the black matrix area 1312 surrounds the display area 1311. The display area 1311 is configured to display information, such as images and texts, while the black matrix area 1312 is not used to display information. The black matrix area 1312 may be formed by printing ink at a periphery of the second surface 132. The black matrix area 1312 includes a first window region 1320. The light-permeable display screen 13 is configured for light-emitting display through the display area 1311 and the first surface 131. The optical sensor 16 includes an emitter 1611 and a receiver 1612, the emitter 1611 is configured to emit an infrared light through the first window region 1320, and the receiver 1612 is configured to receive the infrared light through the second surface 132, i.e. one of the display area 1311 and the black matrix area 1312. In some embodiments, the receiver 1612 is further configured to receive a visible light through the one of the display area 1311 and the black matrix area 1312.

It can be understood that the first surface 131 of the light-permeable display screen 13 also includes a display area corresponding to that of the second surface 132 of the light-permeable display screen 13 and a black matrix area corresponding to that of the second surface 132 of the light-permeable display screen 13, in terms of functions.

That is, the first surface 131 may not be printed with ink at a periphery thereof, but the first surface 131 actually includes the display area and the black matrix area in functions correspondingly, due to the arrangement of the display area and the black matrix area of the second surface 132. Thus, the whole light-permeable display screen 13 includes a display area and a black matrix area extending from the first surface 131 to the second surface 132.

The emitter 1611 is configured to emit an infrared light. The infrared light passes through the first window region 1320 and then through the first surface 131 to outside. When the infrared light emitted by the emitter 1611 encounters an obstacle in a detection direction, a part of the infrared light will be reflected back, passes through the first surface 131 and then through the display area 1311 or the black matrix area 1312 in the second surface 132, and finally is received by the receiver 1612, and thus a distance from the electronic device 100 to the obstacle can be determined by a processor calculating a time of the infrared light from being emitted to being reflected back, such that a corresponding adjustment can be made. For example, when the user makes or receives a call, the electronic device 100 is moved towards the user's head, the emitter 1611 emits the infrared light, and the receiver 1612 receives the infrared light reflected back from the head. After the processor calculates the time of the infrared light from being emitted to being reflected back, a corresponding instruction is generated to control the display screen to turn off its backlight. When the electronic device 100 moves away from the head, the processor calculates again according to the data feedback and generates an instruction to turn on the backlight of the display screen again. In this way, the user's misoperations are prevented, and the battery power of the mobile phone can be saved.

In some embodiments, the receiver 1612 is further configured to detect a light intensity of an environment in which the electronic device 100 is. When the electronic device 100 is in the sun or in a relatively dark environment, the receiver 1612 feeds the light intensity of the surrounding environment back to the processor, and the processor generates the corresponding instruction according to the light intensity, so as to adjust the backlight of the display screen. In actual operations, the receiver 1612 receives the infrared light and the visible light at different time. For example, when a related operation such as receiving a call is performed, a distance detection is conducted; when a related operation such as browsing the displayed content is performed, an ambient brightness detection is conducted.

In some embodiments, the electronic device 100 further includes a housing 20, and the housing 20 is configured to receive elements of the electronic device 100 to provide a protection function therefor. By arranging the electronic device 100 in the housing 20, the electronic device 100 is enclosed, such that elements inside the electronic device 100 are protected from direct damages resulted from external factors. The housing 20 may be formed by a computer numerical control (CNC) machine tool processing an aluminium alloy, or may be molded by injection of Polycarbonate (PC) or of PC and acrylonitrile butadiene styrene (ABS) materials.

In conclusion, in the electronic device 100 according to embodiments of the present disclosure, the optical sensor 16 can be arranged below the light-permeable display screen 13 with the full-screen display, and thus the conventional operation for providing the hole is avoided, thus ensuring the reliability of the strength of the whole black matrix area of the electronic device 100, and further improving a screen-to-body ratio of the electronic device 100. By providing the emitter 1611 of the optical sensor at the black matrix area 1312, the infrared light emitted by the emitter 1611 can be prevent from affecting operation stability of a thin film transistor (TFT) of the display area 1311.

In some embodiments, the light-permeable display screen 13 includes an organic light emitting diode (OLED) display screen.

In some embodiments, the OLED display screen has great transparency and allows the visible light and the infrared light to pass therethrough. Thus, the OLED display screen will not affect the optical sensor in emitting and receiving the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this.

Figure 4:
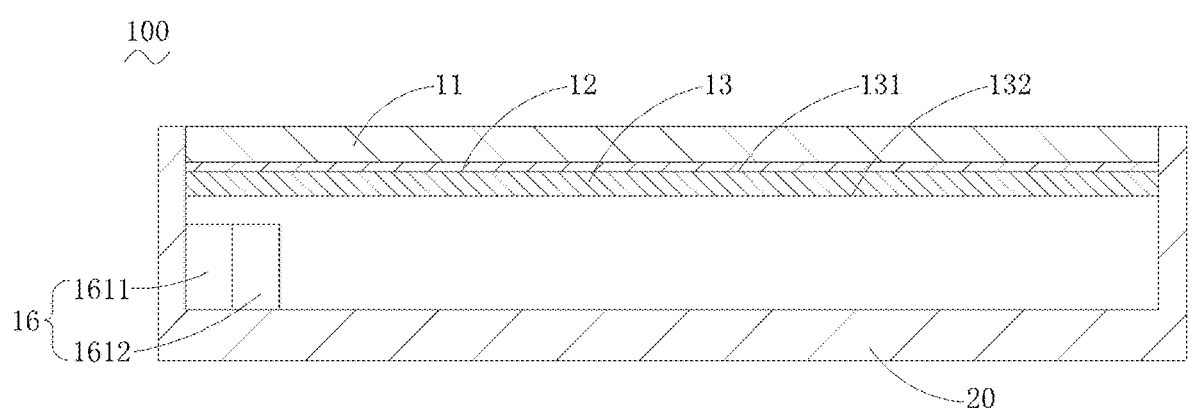
FIG. 4 is a sectional view of the electronic device according to some embodiments of the present disclosure.

As illustrated in FIG. 4, in some embodiments, the electronic device 100 further includes a light-permeable touch panel 12 and a light-permeable cover plate 11. The light-permeable cover plate 11 is arranged on the light-permeable touch panel 12, the light-permeable touch panel 12 is arranged on the light-permeable display screen 13, and the first surface 131 of the light-permeable display screen 13 faces the light-permeable touch panel 12. The light-permeable touch panel 12 and the light-permeable cover plate 13 each have a light transmittance for the visible light larger than 90% and a light transmittance for the infrared light larger than 90%.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 may be laminated with the light-permeable display screen 13 by using an in-cell lamination technology or an on-cell lamination technology, thus effectively reducing a weight and a whole thickness of the display screen.

In addition, since the light-permeable cover plate 11 is arranged on the light-permeable touch panel 12, the light-permeable touch panel 12 and its internal structures can be protected effectively, thus preventing the light-permeable touch panel 12 and the light-permeable display screen 13 from being damaged by an external force. The light-permeable cover plate 11 and the light-permeable touch panel 12 each have a light transmittance for the visible light larger than 90% and a light transmittance for the infrared light larger than 90%, thus facilitating the light-permeable display screen 13 to display the content better, and also facilitating the optical sensor 16 arranged below the light-permeable display screen 13 to emit and receive the infrared light stably, thereby ensuring normal operations of the optical sensor 16.

Figure 3:
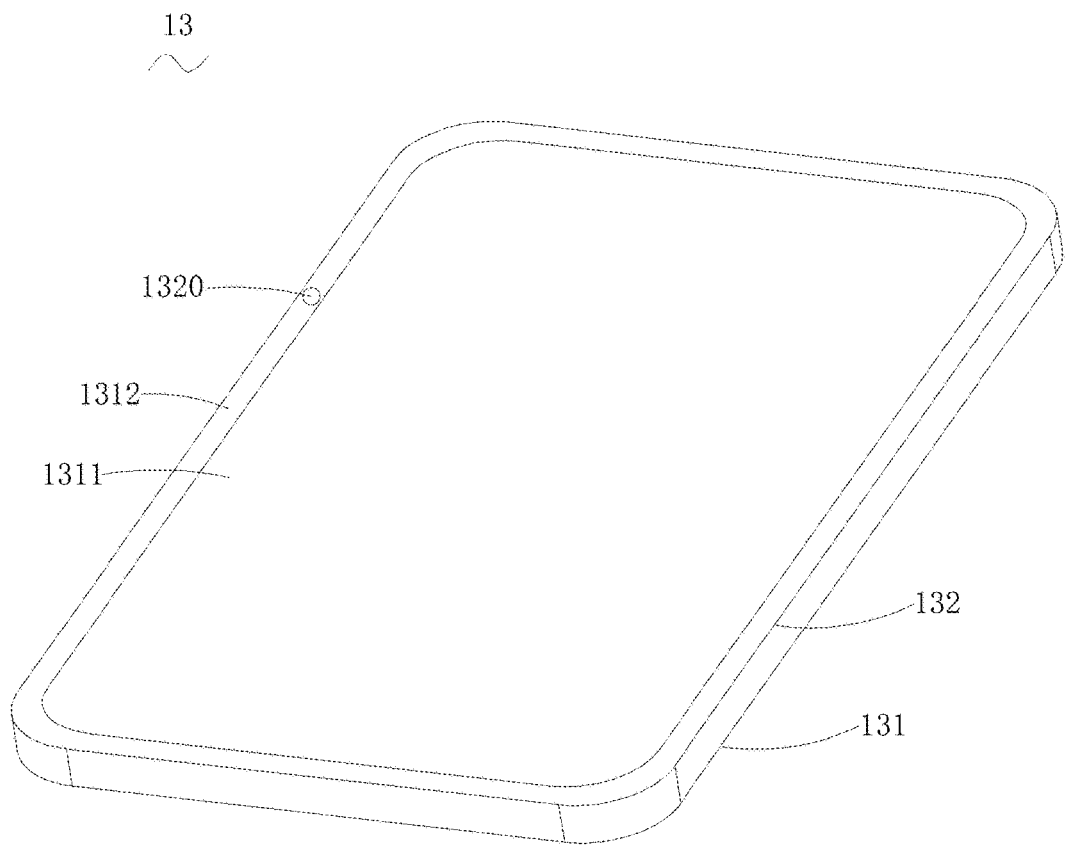
FIG. 3 is a perspective view of a light-permeable display screen in the present disclosure.

As illustrated in FIG. 3, in some embodiments, the light-permeable display screen 13 is configured for light-emitting display through the display area 1311, and a ratio of an area of the display area 1311 to an area of the light-permeable cover plate 11 is larger than 90%.

By setting the ratio of the area of the display area 1311 to the area of the light-permeable cover plate 11, the display area 1311 can display the content with a relatively large area size after the light-permeable display screen 13 is laminated with the light-permeable cover plate 11, thus improving the user experience, increasing the screen-to-body ratio of the electronic device 100, and hence achieving the full-screen display. The black matrix area 1312 may also be configured to shield other elements and metal wires located below the light-permeable display screen 13, thus allowing the appearance of the electronic device 100 to be consistent. The black matrix area 1312 may enhance an optical density of the light-permeable display screen 13 by means of ink printing, so as to provide a great visual effect while ensuring a light shield function.

Figure 5:
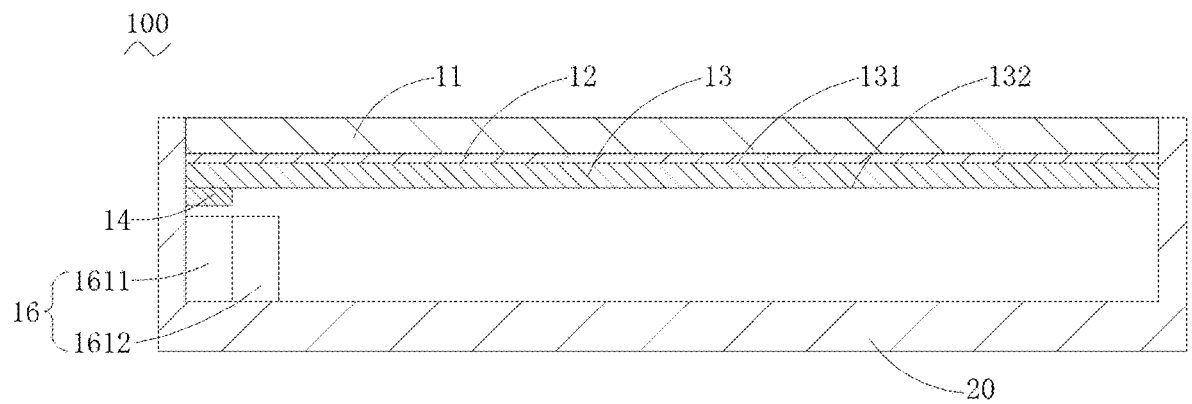
FIG. 5 is a sectional view of the electronic device according to some embodiments of the present disclosure.

As illustrated in FIGS. 5, in some embodiments, the electronic device 100 further includes a coating layer 14, and the coating layer 14 is coated at the first window region 1320 and covers the emitter 1611.

In some embodiments, the black matrix area 1312 is usually printed with black ink for light shield, such that the other elements and metal wires located below the light-permeable display screen 13 are invisible. Since the emitter 1611 is arranged opposite to or even located in the first window region 1320 of the black matrix area 1312, in order to ensure normal operations of the emitter 1611, the first window region 1320 of the black matrix area 1312 is not printed with the black ink, while the coating layer 14 which has characteristics of blocking the visible light and allowing the infrared light to pass therethrough needs to be coated at the first window region 1320. Thus, in a direction in which the optical sensor 16 is stacked with the light-permeable display screen 13, an area of an orthographic projection of the coating layer 14 in the first window region 1320 covers an area of an orthographic projection of the emitter 1611 in the first window region 1320, such that the coating layer 14 can shield the emitter 1611 fully without affecting the emitter 1611 in emitting the infrared light normally, thus achieving an effect that the emitter 1611 is invisible when the electronic device 100 is observed from outside.

In some embodiments, the coating layer 14 is configured to allow the infrared light to pass therethrough and to block the visible light, and the emitter 1611 is configured to emit the infrared light through the coating layer 14 and the first window region 1320.

Since the coating layer 14 allows the infrared light to pass therethrough, when the emitter 1611 sends the infrared light out for detection, an intensity decrease of the infrared light is relatively small after the infrared light passes through the coating layer 14, or the intensity decrease of the infrared light will not affect the detection process, thus ensuring the normal operations of the emitter 1611. Since the coating layer 14 can block the visible light, the visible light cannot pass through the coating layer 14, such that the emitter 1611 is visually shielded, thus achieving the effect that the emitter 1611 is invisible when the electronic device 100 is observed from outside.

In some embodiments, the coating layer 14 includes an infrared (IR) ink, the IR ink has a light transmittance for the infrared light larger than 85% and a light transmittance for the visible light less than 6%, and the IR ink allows the infrared light whose wave length ranges from 850 nm to 940 nm to pass therethrough.

Since the IR ink has a low light transmittance for the visible light, the emitter 1611 arranged below the coating layer 14 cannot be saw via a visual sense based on human eyes, when the electronic device 100 is observed from outside. Also, since the IR ink further has a high light transmittance for the infrared light, the emitter 1611 can emit the infrared light stably, thus ensuring the normal operations of the emitter 1611.

In some embodiments, the optical sensor 16 includes a proximity sensor and an ambient-light sensor. The proximity sensor includes a proximity emitter and a proximity receiver, the proximity emitter is configured to emit the infrared light through the coating layer 14 and the first window region 1320, and the proximity receiver is configured to receive the infrared light reflected by an object so as to detect a distance from the object to the electronic device 100. The ambient-light sensor includes an ambient-light receiver, and the ambient-light receiver is configured to sense an ambient light so as to adjust a brightness of the light-permeable display screen 13.

In some embodiments, when the user makes or receives a call, the electronic device 100 is moved towards the user's head, the proximity emitter emits the infrared light, and the proximity receiver receives the reflected infrared light. The processor calculates the time of the infrared light from being emitted to being reflected back, and generates a corresponding instruction to control the display screen to turn off its backlight. When the electronic device 100 moves away from the head, the processor calculates again according to the data feedback and generates an instruction to turn on the backlight of the display screen again. In this way, the user's misoperations are prevented, and the battery power of the mobile phone can be saved. In addition, the ambient-light receiver is configured to detect a light intensity of an environment in which the electronic device 100 is. When the electronic device 100 is in the sun or in a relatively dark environment, the ambient-light receiver feeds the light intensity of the surrounding environment back to the processor, and the processor generates the corresponding instruction according to the light intensity so as to adjust the backlight of the display screen.

In some embodiments, the proximity receiver and the ambient-light receiver are multiplexed.

In some embodiments, the proximity receiver and the ambient-light receiver are integrated as a whole, so as to effectively reduce a whole size of the elements, to improve the space utilization of the electronic device 100, and also to provide possible positions for other elements, such that the electronic device 100 can allocate spatial positions of various elements fully. In actual operations, the proximity receiver receives the infrared light and the visible light at different time. For example, when a related operation such as receiving a call is performed, a distance detection is conducted; when a related operation such as browsing the displayed content is performed, an ambient brightness detection is conducted.

Figure 6A:
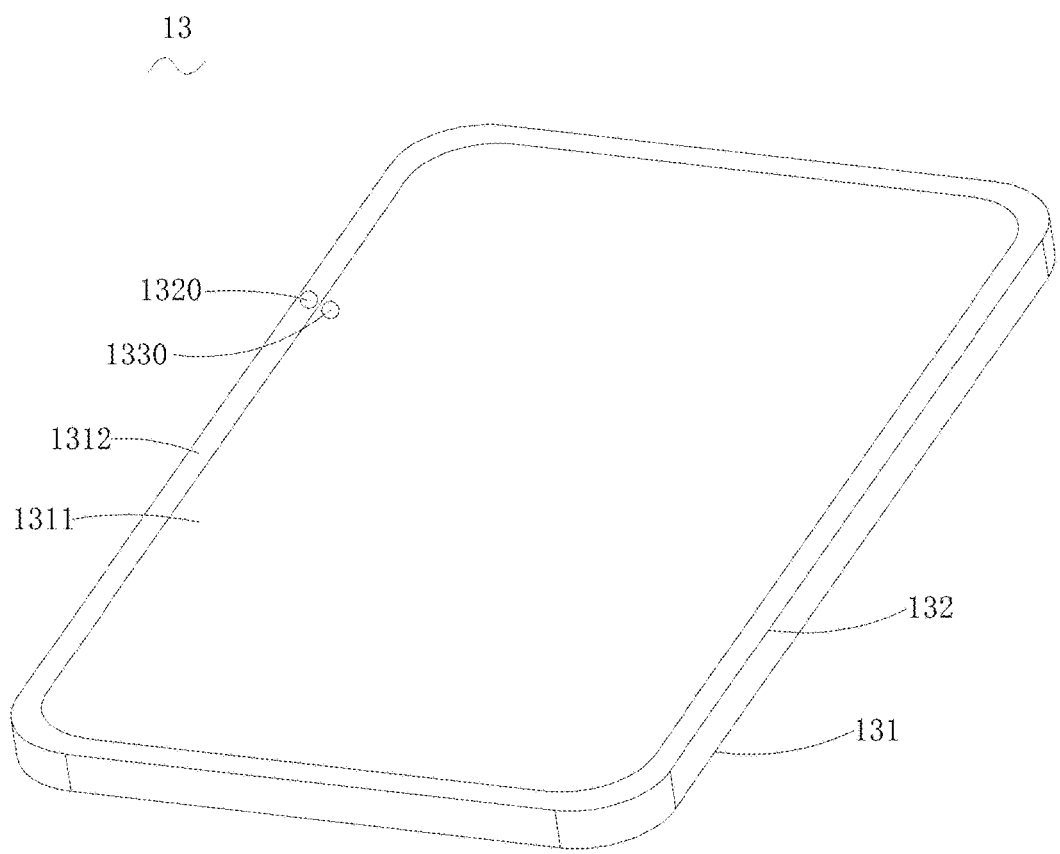
FIG. 6A and FIG. 6B are perspective views of a light-permeable display screen in the present disclosure, in which the light-permeable display screen may be applied to the electronic device illustrated in FIG. 5.
Figure 6B:
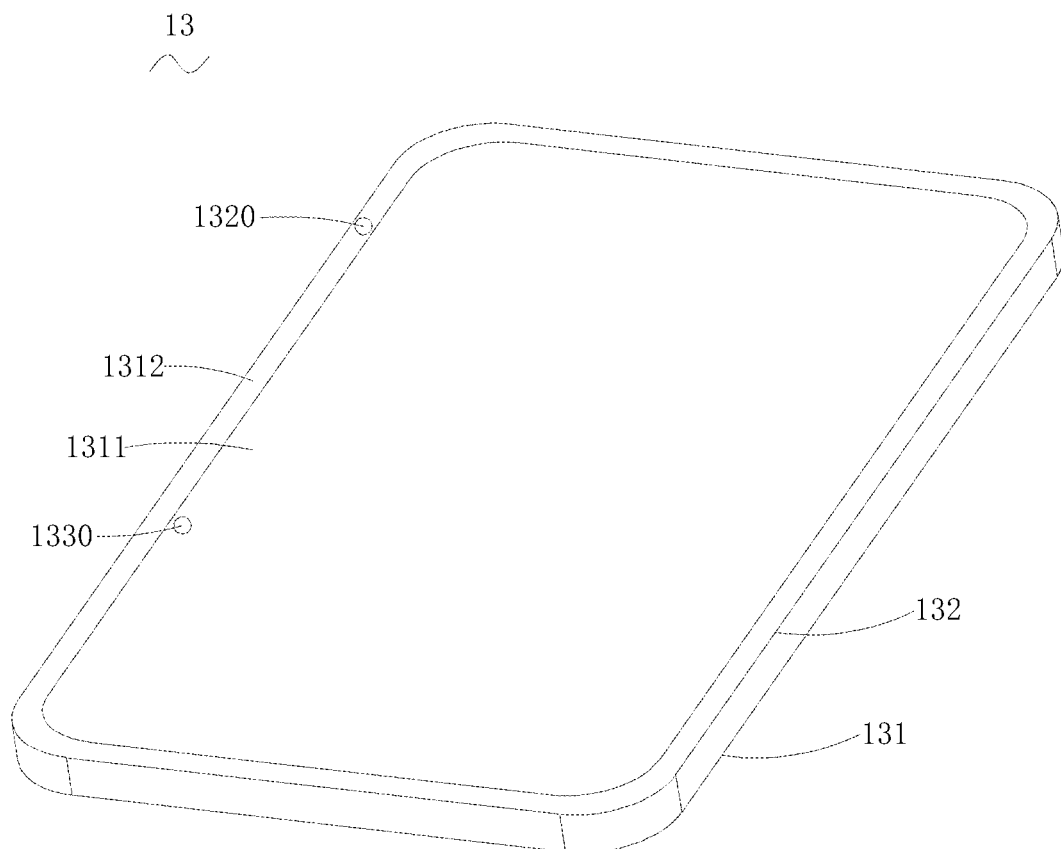
Figure 7:
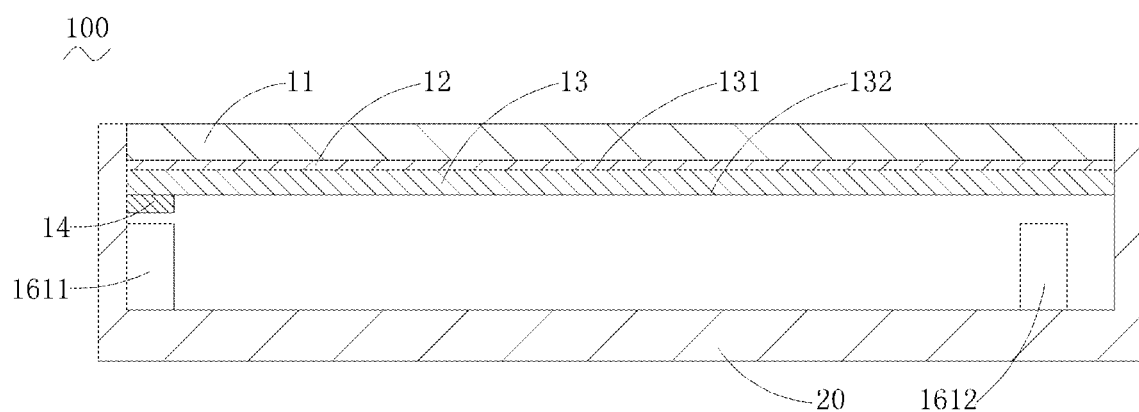
FIG. 7 is a sectional view of the electronic device according to some embodiments of the present disclosure.
Figure 8A:
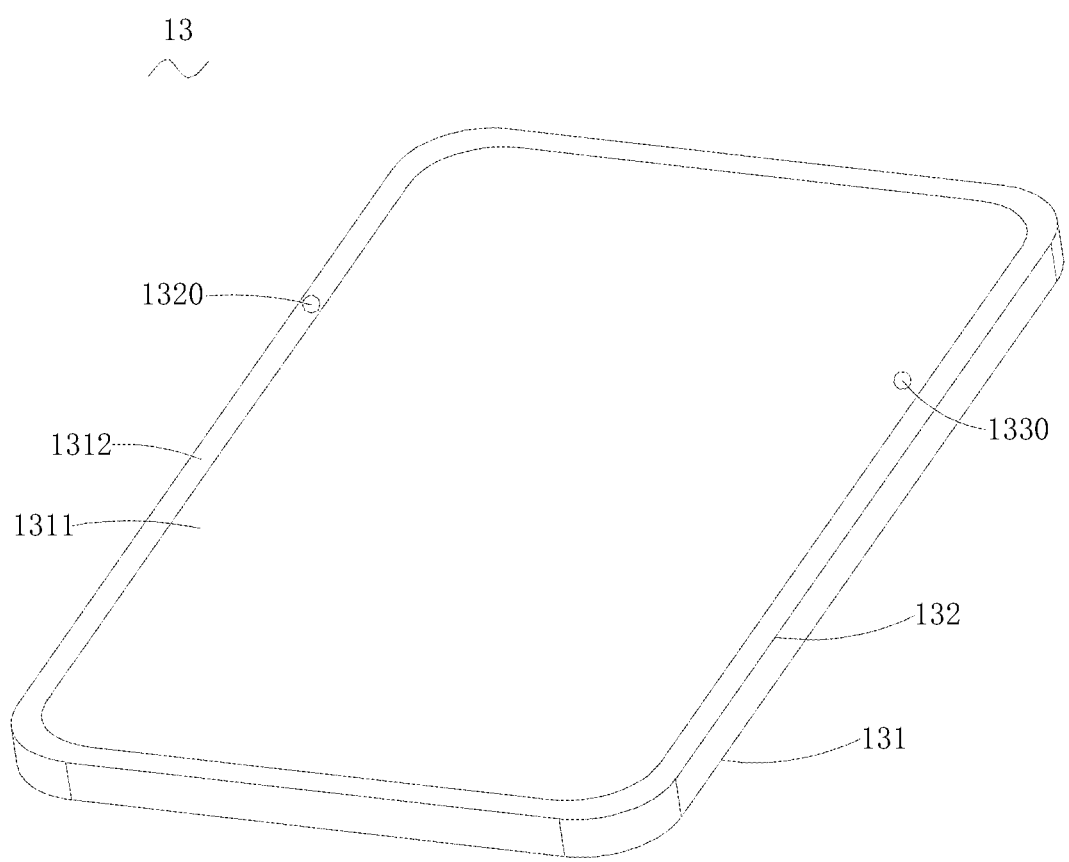
FIG. 8A and FIG. 8B are perspective views of a light-permeable display screen in the present disclosure, in which the light-permeable display screen may be applied to the electronic device illustrated in FIG. 7.
Figure 8B:
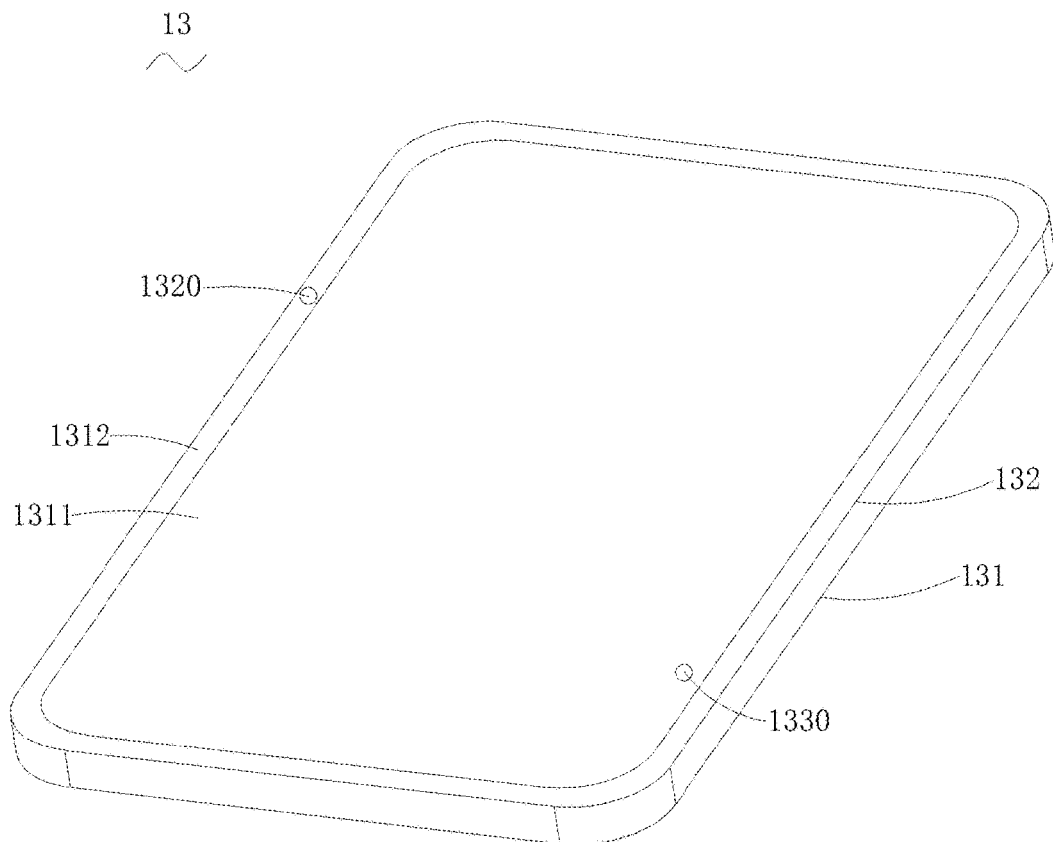

As illustrated in FIGS. 5 to 6B or in FIGS. 7 to 8B, in some embodiments, the display area 1311 includes a second window region 1330, and the receiver 1612 is configured to receive the infrared light and/or the visible light through the second window region 1330.

In some embodiments, the receiver 1612 may be arranged opposite to or even located in the second window region 1330 of the display area 1311. Since the second window region 1330 needs to allow the infrared light and the visible light to pass therethrough, the ink or other coatings need not to be coated at the second window region 1330.

Figure 9:
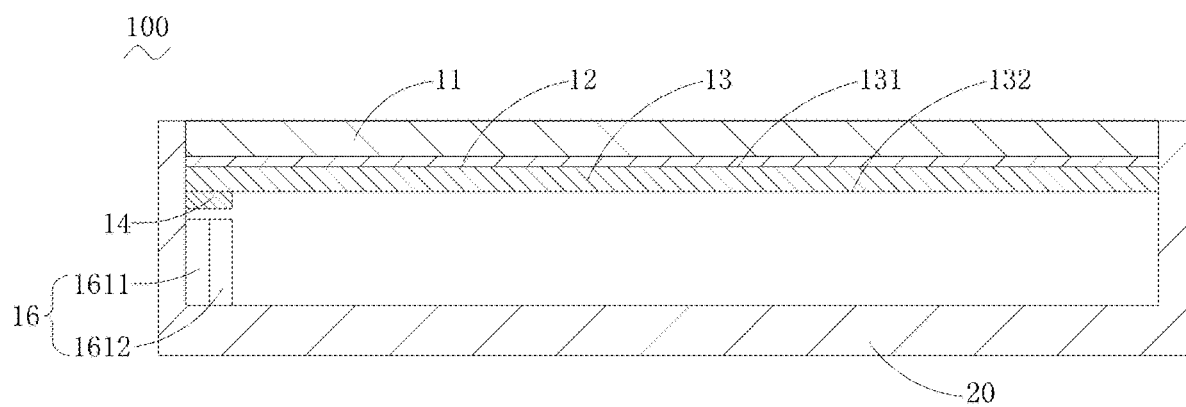
FIG. 9 is a sectional view of the electronic device according to some embodiments of the present disclosure.
Figure 10:
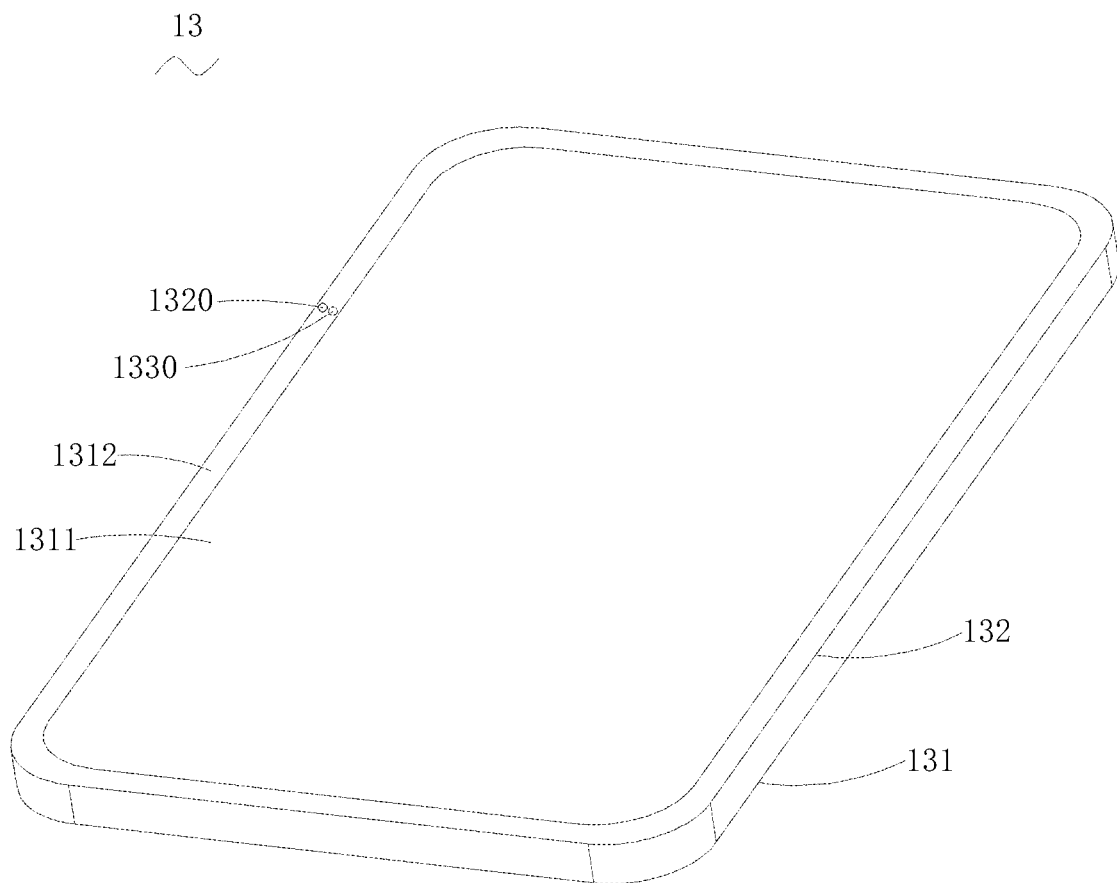
FIG. 10 is a perspective view of a light-permeable display screen in the present disclosure, in which the light-permeable display screen may be applied to the electronic device illustrated in FIG. 9.
Figure 11:
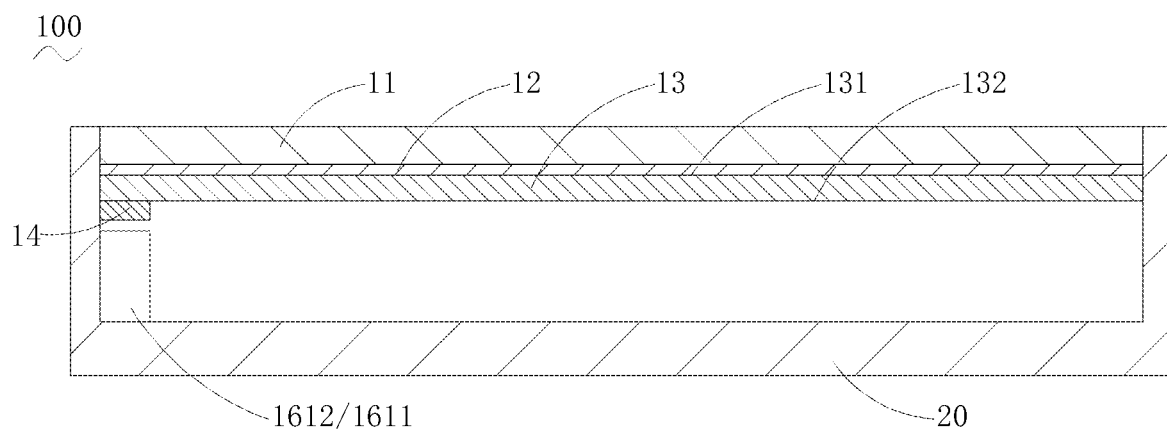
FIG. 11 is a sectional view of the electronic device according to some embodiments of the present disclosure.
Figure 12:
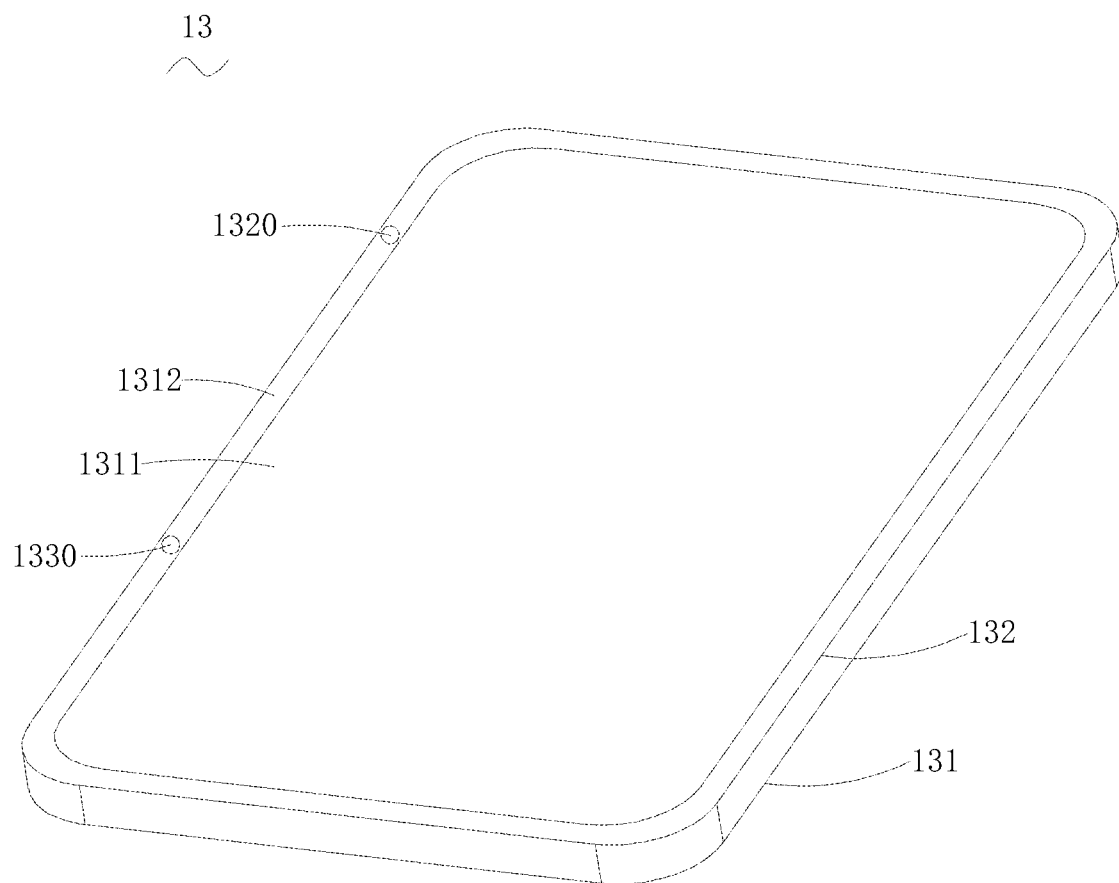
FIG. 12 is a perspective view of a light-permeable display screen in the present disclosure, in which the light-permeable display screen may be applied to the electronic device illustrated in FIG. 11.

As illustrated in FIGS. 9 and 10 or in FIGS. 11 and 12, in some embodiments, the black matrix area 1312 further includes a second window region 1330, and the receiver 1612 is configured to receive the infrared light and/or the visible light through the second window region 1330.

In some embodiments, the receiver 1612 may be arranged opposite to or even located in the second window region 1330 of the black matrix area 1312. Since the second window region 1330 needs to allow the infrared light and the visible light to pass therethrough, the ink or other coatings need not to be coated at the second window region 1330.

In some embodiments of the present disclosure, as illustrated in FIG. 10, the emitter 1611 and the receiver 1612 are arranged in a line parallel with an edge of the light-permeable display screen 13, and the receiver 1612 is arranged adjacent to the emitter 1611.

In some embodiments of the present disclosure, as illustrated in FIGS. 8A and 12, the emitter 1611 and the receiver 1612 are arranged in a line parallel with an edge of the light-permeable display screen 13, and the receiver 1612 is spaced apart from the emitter 1611.

In some embodiments of the present disclosure, as illustrated in FIG. 6A, the receiver 1612 is staggered with the emitter 1611 relative to an edge of the light-permeable display screen 13, and the receiver 1612 is arranged adjacent to the emitter 1611.

In some embodiments of the present disclosure, as illustrated in FIGS. 6B and 8B, the receiver 1612 is staggered with the emitter 1611 relative to an edge of the light-permeable display screen 13, and the receiver 1612 is spaced apart from the emitter 1611.

Figure 13A:
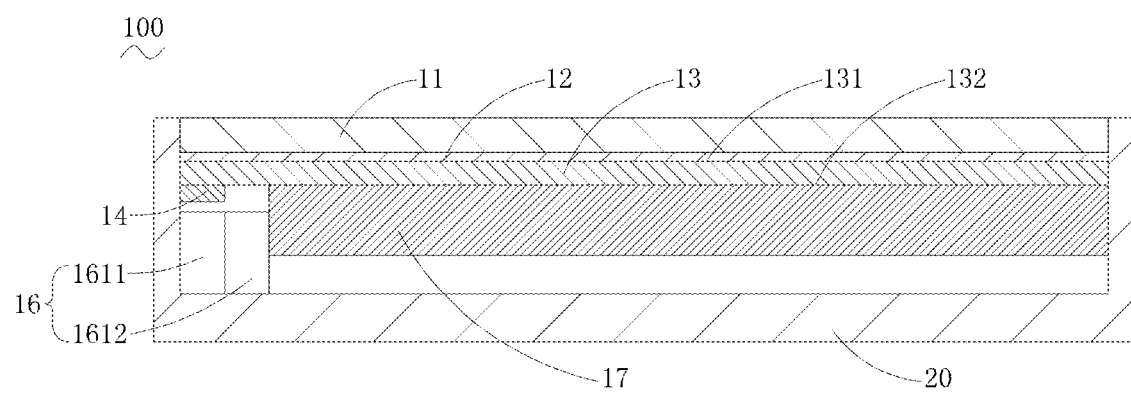
FIG. 13A and FIG. 13B are sectional views of the electronic device according to some embodiments of the present disclosure.
Figure 13B:
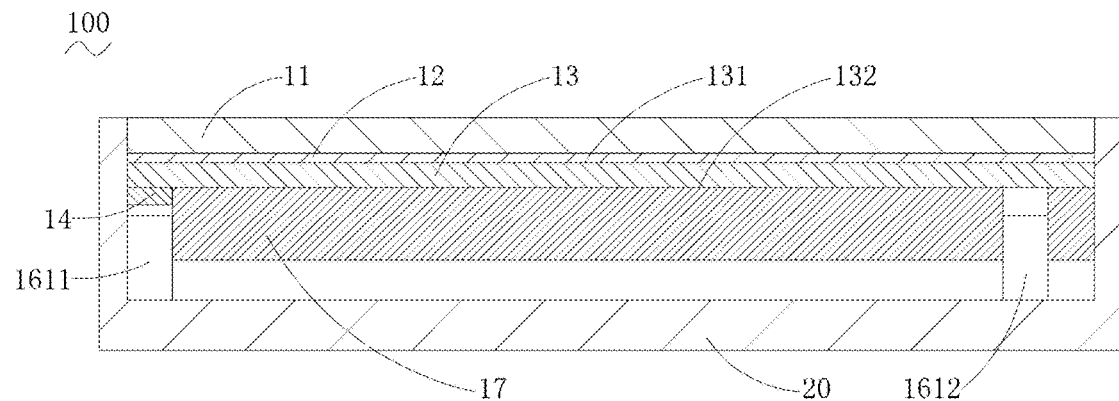

As illustrated in FIG. 13A or 13B, in some embodiments, the electronic device 100 further includes a buffer layer 17 covering the second surface 132.

In some embodiments, the buffer layer 17 is configured to buffer an impact force and hence to be quakeproof, so as to protect the light-permeable touch panel 12 and the light-permeable display screen 13 as well as their internal structures, thus preventing the display screen from being damaged by an external impact effect. The buffer layer 17 may be made of foam, foamed plastics, rubber or other soft materials. Certainly, these buffer materials are merely exemplary, and embodiments of the present disclosure are not limited to this. In addition, when the receiver 1612 is arranged at the display area, in order to prevent the buffer layer 17 from blocking the signal reception of the receiver 1612, the receiver 1612 is avoided in a process of providing the buffer layer 17, such that the receiver 1612 will not be affected in receiving the infrared light and/or the visible light.

Figure 14A:
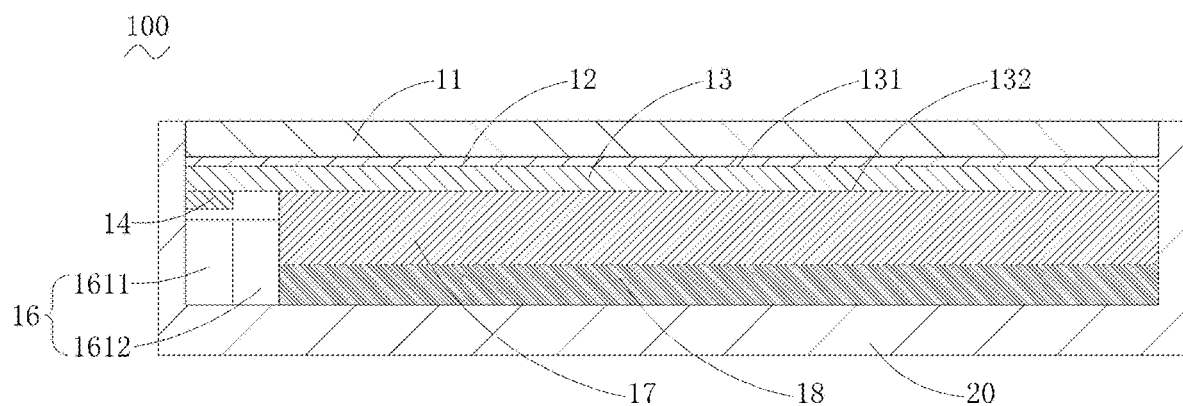
FIG. 14A and FIG. 14B are sectional views of the electronic device according to some embodiments in the present disclosure.
Figure 14B:
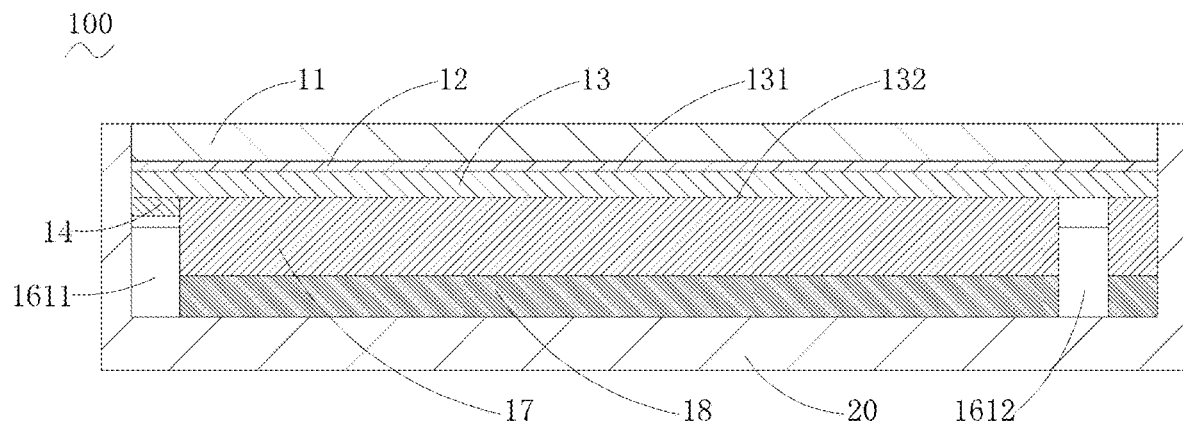

As illustrated in FIG. 14A or 14B, furthermore, in such embodiments, the electronic device 100 further includes a metal sheet 18 covering the buffer layer 17.

In some embodiments, the metal sheet 18 is configured for shielding electromagnetic interferences and also for grounding, and further has a function of diffusing a temperature rise. The metal sheet 18 may be formed by cutting metal materials such as a copper foil and an aluminum foil. Certainly, these metal materials are merely exemplary, and embodiments of the present disclosure are not limited to this. In addition, when the receiver 1612 is arranged at the display area, in order to prevent the metal sheet 18 from blocking the signal reception of the receiver 1612, the receiver 1612 is avoided in a process of providing the metal sheet 18, such that the receiver 1612 will not be affected in receiving the infrared light and/or the visible light.

Figure 15:
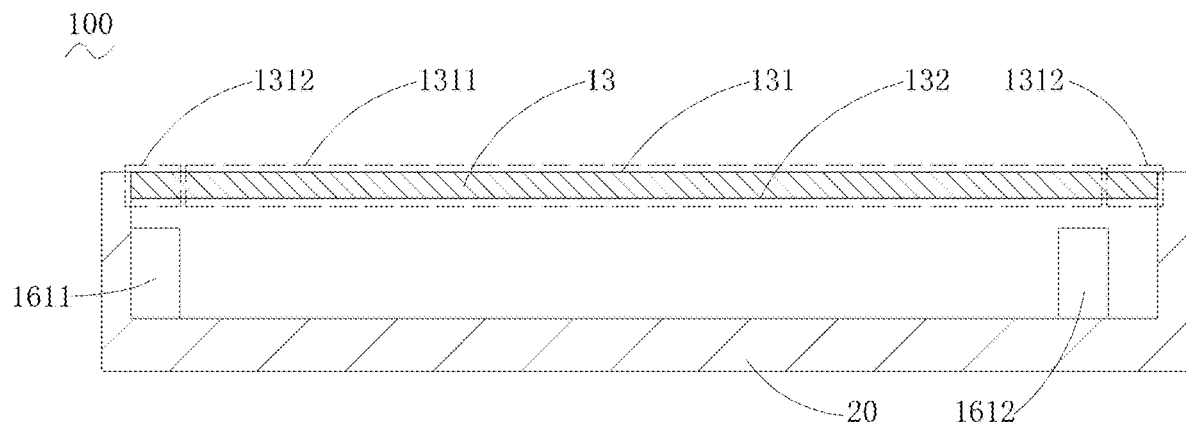
FIG. 15 is a sectional view of the electronic device according to some embodiments of the present disclosure.
Figure 16:
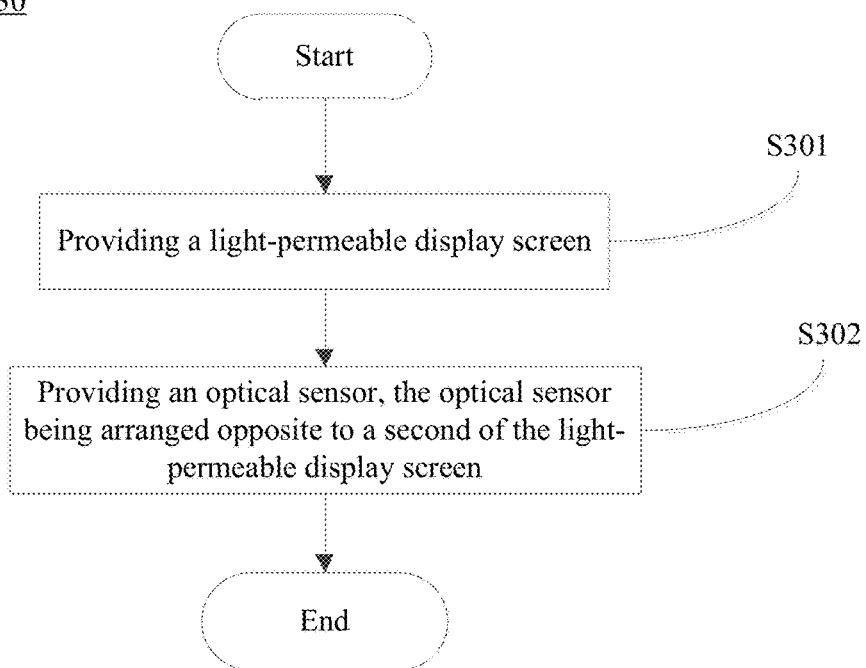
FIG. 16 is a block diagram of a manufacturing method for an electronic device in the present disclosure.

As illustrated in FIGS. 2 and 16 or in FIGS. 15 and 16, embodiments of the present disclosure provide a manufacturing method 30 for the electronic device 100, and the manufacturing method 30 includes actions in followings blocks.

In block 5301, a light-permeable display screen 13 is provided. The light-permeable display screen 13 includes a first surface 131 and a second surface 132, and the second surface 132 faces away from the first surface 131. The second surface 132 includes a display area 1311 and a black matrix area 1312 surrounding the display area 1311, and the black matrix area 1312 includes a first window region 1320. The light-permeable display screen 13 is configured for light-emitting display through the display area and the first surface 131.

In block 5302, an optical sensor 16 is provided. The optical sensor 16 includes an emitter 1611 configured to emit the infrared light through the first window region 1320 and a receiver 1612 configured to receive the infrared light (and also the visible light in some embodiments) through the second surface 132, i.e. one of the display area 1311 and the black matrix area 1312.

In the manufacturing method according to embodiments of the present disclosure, the light-permeable display screen 13 is used, such that the optical sensor 16 can be arranged below the light-permeable display screen 13 with the full-screen display, and thus the conventional operation for providing the hole is avoided, thus ensuring the reliability of the strength of the whole black matrix area of the electronic device 100, and further improving a screen-to-body ratio of the electronic device 100. By providing the emitter 1611 of the optical sensor at the black matrix area 1312, the infrared light emitted by the emitter 1611 can be prevent from affecting operation stability of a thin film transistor (TFT) of the display area 1311. The light-permeable display screen 13 may be an organic light emitting diode (OLED) display screen. The OLED display screen has great transparency and allows the visible light and the infrared light to pass therethrough. Thus, the OLED display screen will not affect the infrared sensor in emitting and receiving the infrared light while displaying content. The light-permeable display screen 13 may adopt a Micro light-emitting diode (LED) display screen. The Micro LED display screen also has a great light transmittance for the visible light and the infrared light. Certainly, these display screens are merely exemplary, and embodiments of the present disclosure are not limited to this. Moreover, the first surface 131 of the light-permeable display screen 13 allows the visible light to pass therethrough so as to display the content on one hand, and also allows the infrared light to pass therethrough on the other hand, such that the optical sensor 16 can emit and receive the infrared light normally.

Figure 17:
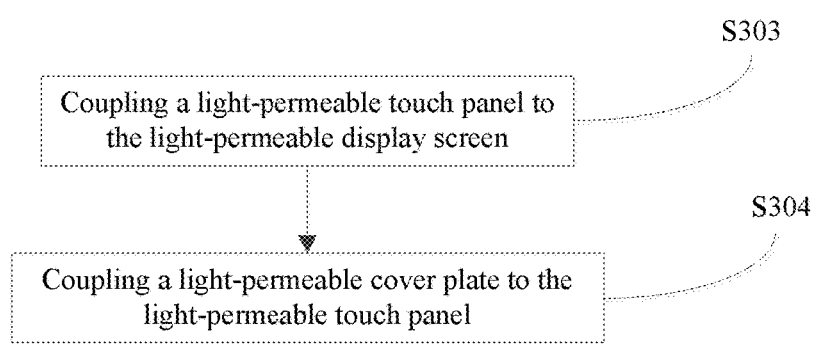
FIG. 17 is a block diagram of the manufacturing method for the electronic device according to some embodiments of the present disclosure, in which a further action is illustrated.

As illustrated in FIGS. 5 and 17 or in FIGS. 7 and 17, in some embodiments, the manufacturing method 30 for the electronic device 100 further includes actions in following blocks.

In block S303, a light-permeable touch panel 12 is coupled to the light-permeable display screen 13. In some embodiments, the light-permeable touch panel 12 is arranged on the first surface 131 of the light-permeable display screen 13.

In block S304, a light-permeable cover plate 11 is coupled to the light-permeable touch panel 12. In some embodiments, the light-permeable cover plate 11 is arranged on a side of the light-permeable touch panel 12 facing away from the light-permeable display screen 13.

In some embodiments, the light-permeable touch panel 12 is mainly configured to receive an input signal generated when the user touches the light-permeable touch panel 12 and to transmit the input signal to the circuit board for data process, so as to obtain a specific position where the user touches the light-permeable touch panel 12. The light-permeable touch panel 12 is laminated with the light-permeable display screen 13 by using an in-cell lamination technology or an on-cell lamination technology, thus effectively reducing a weight and a whole thickness of the display screen. In addition, since the light-permeable cover plate 11 is arranged on the light-permeable touch panel 12, the light-permeable touch panel 12 and its internal structures can be protected, thus preventing the light-permeable touch panel 12 from being damaged directly by an external force.

As illustrated in FIGS. 5 to 6B and 18 or in FIGS. 7 to 8B and 18, in some embodiments, the manufacturing method 30 for the electronic device 100 further includes an action in a following block.

In block S305, a coating layer 14 is coated at the first window region 1320. The coating layer 14 covers the emitter 1611, and the emitter 1611 is configured to emit the infrared light through the coating layer 14 and the first window region 1320.

In some embodiments, the black matrix area 1312 is usually printed with black ink for light shield, such that the other elements and metal wires located below the light-permeable display screen 13 are invisible. Since the emitter 1611 is located in the first window region 1320 of the black matrix area 1312, in order to ensure normal operations of the emitter 1611, the first window region 1320 of the black matrix area 1312 is not printed with the black ink, while the coating layer 14 which has characteristics of blocking the visible light and allowing the infrared light to pass therethrough needs to be coated at the first window region 1320. Thus, in a direction in which the optical sensor 16 is stacked with the light-permeable display screen 13, an area of an orthographic projection of the coating layer 14 in the first window region 1320 covers an area of an orthographic projection of the emitter 1611 in the first window region 1320, such that the coating layer 14 can shield the emitter 1611 fully without affecting the emitter 1611 in emitting the infrared light normally, thus achieving an effect that the emitter 1611 is invisible when the electronic device 100 is observed from outside. The coating layer 14 may use an infrared (IR) ink. Since the IR ink has a low light transmittance for the visible light, the emitter 1611 arranged below the coating layer 14 cannot be saw via a visual sense based on human eyes, when the electronic device 100 is observed from outside. Also, since the IR ink further has a high light transmittance for the infrared light, the emitter 1611 can emit the infrared light stably, thus ensuring the normal operations of the emitter 1611.

As illustrated in FIGS. 5 to 6B and 19 or in FIGS. 7 to 8B and 19, in some embodiments, the manufacturing method 30 for the electronic device 100 further includes an action in a following block.

In block S306, a second window region 1330 is provided in the display area 1311, and the receiver 1612 is arranged opposite to the second window region 1330.

In some embodiments, the receiver 1612 may be arranged in the second window region 1330 of the display area 1311. Since the second window region 1330 needs to allow the infrared light and the visible light to pass therethrough, the ink or other coatings need not to be coated at the second window region 1330.

As illustrated in FIGS. 9, 10 and 20 or in FIGS. 11, 12 and 20, in some embodiments, the manufacturing method 30 for the electronic device 100 further includes an action in a following block.

In block S307, a second window region 1330 is provided in the black matrix area 1312, and the receiver 1612 is arranged opposite to the second window region 1330.

In some embodiments, the receiver 1612 may be arranged in the second window region 1330 of the black matrix area 1312. Since the second window region 1330 needs to allow the infrared light and the visible light to pass therethrough, the ink or other coatings need not to be coated at the second window region 1330.

As illustrated in FIGS. 13A and 21 or in FIGS. 13B and 21, in some embodiments, the manufacturing method 30 for the electronic device 100 further includes an action in a following block.

In block S308, a buffer layer 17 is coupled to the second surface 132, and the buffer layer 17 covers the second surface 132.

In some embodiments, the buffer layer 17 is configured to buffer an impact force and hence to be quakeproof, so as to protect the light-permeable touch panel and the light-permeable display screen as well as their internal structures, thus preventing the display screen from being damaged by an external impact effect. The buffer layer 17 may be made of foam, foamed plastics, rubber or other soft materials. Certainly, these buffer materials are merely exemplary, and embodiments of the present disclosure are not limited to this. In addition, in order to prevent the buffer layer 17 from blocking the signal reception of the receiver 1612, the receiver 1612 is avoided in a process of providing the buffer layer 17, such that the receiver 1612 will not be affected in receiving the infrared light.

As illustrated in FIGS. 14A and 22 or in FIGS. 14B and 22, furthermore, in some embodiments, the manufacturing method 30 for the electronic device 100 further includes an action in a following block.

In block S309, a metal sheet 18 is provided below the buffer layer 17, and the metal sheet 18 covers the buffer layer 17.

In some embodiments, the metal sheet 18 is configured for shielding electromagnetic interferences and also for grounding, and further has a function of diffusing a temperature rise. The metal sheet 18 may be formed by cutting metal materials such as a copper foil and an aluminum foil. Certainly, these metal materials are merely exemplary, and embodiments of the present disclosure are not limited to this. In addition, in order to prevent the metal sheet 18 from blocking the signal reception of the receiver 1612, the receiver 1612 is avoided in a process of providing the metal sheet 18, such that the receiver 1612 is not affected in receiving the infrared light.

In the description of the present disclosure, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature, unless otherwise specified. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation larger than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation smaller than the sea level elevation of the second feature.

The following disclosure provides many different embodiments or examples to realize different structures of the present disclosure. To simplify the disclosure of the present disclosure, components and configurations in particular examples are elaborated. Of course, they are illustrative, and are not intended to limit the present disclosure. Moreover, reference numbers and/or letters may be repeated in different examples of the present disclosure for the purpose of simplicity and clarity, which shall not be constructed to indicate the relationships among various embodiments and/or configurations. In addition, the present disclosure provides examples of various specific processes and materials, but applicability of other processes and/or utilization of other materials are conceivable for those skilled in the art.

In the specification, it is to be understood that terms such as "upper," "lower," "front," "rear," "top," "bottom," should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance and are not intended to implicitly indicate the number of the technical feature mentioned. Thus, features limited by "first" and "second" are intended to indicate or imply including one or more than one these features. In the description of the present disclosure, "a plurality of" means two or more than two, unless specified otherwise.

In the present disclosure, unless specified or limited otherwise, the terms "mounted," "connected," "coupled" and the like are used broadly, and may be, for example, fixed connections, detachable connections, or integral connections; may also be mechanical or electrical connections; may also be direct connections or indirect connections via intervening structures; may also be inner communications of two elements or interaction relationships between two elements. The above terms can be understood by those skilled in the art according to specific situations.

Reference throughout this specification to "an embodiment," "some embodiments," "one embodiment," "another example," "an example," "a specific examples" or "some examples" means that a particular feature, structure, material, or characteristic described in connection with the embodiment or example is included in at least one embodiment or example of the present disclosure. Thus, the appearances of such phrases in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An electronic device, comprising:
   a housing;
   a light-permeable display screen received in the housing and comprising a display area and a black matrix area surrounding the display area, the black matrix area comprising a first window region;
   an emitter arranged at a side of the light-permeable display screen and opposite to the first window region of the black matrix area, the emitter being configured to emit an infrared light through the first window region; and
   a receiver arranged at the side of the light-permeable display screen and configured to receive the infrared light through the light-permeable display screen,
   wherein the electronic device further comprises a coating layer coated at the first window region and shielding the emitter, the coating layer is configured to allow the infrared light to pass through and to block a visible light, and the emitter is configured to emit the infrared light through the coating layer and the first window region,
   wherein the coating layer comprises an infrared ink, the infrared ink has a light transmittance for the infrared light larger than 85% and a light transmittance for the visible light less than 6%, and the infrared ink allows the infrared light whose wave length ranges from 850 nm to 940 nm to pass through.

2. The electronic device according to claim 1, wherein the receiver is arranged opposite to the black matrix area of the light-permeable display screen.

3. The electronic device according to claim 2, wherein the black matrix area comprises a second window region, and the receiver is configured to receive the infrared light through the second window region,
   wherein the receiver is further configured to receive a visible light through the second window region.

4. The electronic device according to claim 1, wherein the receiver is arranged opposite to the display area of the light-permeable display screen.

5. The electronic device according to claim 4, wherein the display area comprises a second window region, and the receiver is configured to receive the infrared light through the second window region,
   wherein the receiver is further configured to receive a visible light through the second window region.

6. The electronic device according to claim 1, wherein the emitter and the receiver are arranged in a line parallel with an edge of the light-permeable display screen, and the receiver is arranged adjacent to the emitter.

7. The electronic device according to claim 1, wherein the emitter and the receiver are arranged in a line parallel with an edge of the light-permeable display screen, and the receiver is spaced apart from the emitter.

8. The electronic device according to claim 1, wherein the receiver is staggered with the emitter relative to an edge of the light-permeable display screen, and the receiver is arranged adjacent to the emitter.

9. The electronic device according to claim 1, wherein the receiver is staggered with the emitter relative to an edge of the light-permeable display screen, and the receiver is spaced apart from the emitter.

10. An electronic device, comprising:
    a light-permeable display screen having a first surface and a second surface facing away from the first surface, the second surface comprising a display area and a black matrix area surrounding the display area, the black matrix area comprising a first window region; and
    an optical sensor disposed opposite to the second surface of the light-permeable display screen, comprising an emitter arranged opposite to the first window region of the black matrix area and configured to emit an infrared light through the first window region, and a receiver configured to receive the infrared light through the light-permeable display screen,
    wherein the optical sensor comprises a proximity sensor and an ambient-light sensor,
    the proximity sensor comprises a proximity emitter and a proximity receiver, the proximity emitter is configured to emit the infrared light through the coating layer and the first window region, the proximity receiver is configured to receive the infrared light reflected by an object so as to detect a distance from the object to the electronic device,
    the ambient-light sensor comprises an ambient-light receiver, and the ambient-light receiver is configured to sense an ambient light so as to adjust a brightness of the light-permeable display screen,
    the proximity emitter serves as the emitter of the optical sensor, and the ambient-light receiver is integrated with the proximity receiver to serve as the receiver of the optical sensor.

11. The electronic device according to claim 10, wherein the proximity receiver and the ambient-light receiver are multiplexed.

12. The electronic device according to claim 10, wherein the receiver is arranged opposite to the display area of the light-permeable display screen, the display area comprises a second window region, and the receiver is configured to receive the infrared light through the second window region.

13. The electronic device according to claim 10, wherein the receiver is arranged opposite to the black matrix area of the light-permeable display screen, the black matrix area comprises a second window region, and the receiver is configured to receive the infrared light through the second window region.

14. The electronic device according to claim 10, wherein the electronic device further comprises a buffer layer covering the second surface of the light-permeable display screen.

15. The electronic device according to claim 10, wherein the electronic device further comprises a metal sheet covering the buffer layer.

16. A manufacturing method for the electronic device, comprising:
- providing a light-permeable display screen, the light-permeable display screen comprising a first surface and a second surface facing away from the first surface, the second surface comprising a display area and a black matrix area surrounding the display area, the black matrix area comprising a first window region; and
- providing an optical sensor, the optical sensor being disposed opposite to the second surface of the light-permeable display screen, comprising an emitter configured to emit an infrared light through the first window region and a receiver configured to receive the infrared light through the light-permeable display screen,
- providing a light-permeable touch panel and a light-permeable cover plate coupled to the light-permeable touch panel, the light-permeable touch panel being coupled to the light-permeable display screen, the first surface of the light-permeable display screen facing the light-permeable touch panel, the light-permeable touch panel and the light-permeable cover plate each having a light transmittance for a visible light larger than 90% and a light transmittance for the infrared light larger than 90%.

* * * * *